(12) United States Patent
Plojoux et al.

(10) Patent No.: US 9,320,085 B2
(45) Date of Patent: Apr. 19, 2016

(54) REDUCED CERAMIC HEATING ELEMENT

(75) Inventors: Julien Plojoux, Geneva (CH); Olivier Greim, Villars-Burquin (CH)

(73) Assignee: Philip Morris Products S.A., Neuchatel (CH)

( * ) Notice: Subject to any disclaimer, the term of this patent is extended or adjusted under 35 U.S.C. 154(b) by 235 days.

(21) Appl. No.: 13/996,734

(22) PCT Filed: Dec. 21, 2011

(86) PCT No.: PCT/EP2011/073587
§ 371 (c)(1),
(2), (4) Date: Aug. 22, 2013

(87) PCT Pub. No.: WO2012/085082
PCT Pub. Date: Jun. 28, 2012

(65) Prior Publication Data
US 2013/0319999 A1    Dec. 5, 2013

(30) Foreign Application Priority Data

Dec. 24, 2010   (EP) ..................................... 10252224

(51) Int. Cl.
| | | |
|---|---|---|
| *H05B 3/10* | (2006.01) | |
| *H05B 3/02* | (2006.01) | |
| *H05B 3/14* | (2006.01) | |
| *H05K 13/00* | (2006.01) | |

(52) U.S. Cl.
CPC .................. *H05B 3/02* (2013.01); *H05B 3/141* (2013.01); *H05K 13/00* (2013.01); *Y10T 29/49083* (2015.01)

(58) Field of Classification Search
CPC ............ H05B 3/02; H05B 3/141; H05B 3/62; H05B 3/00; H05K 113/00; Y10T 29/49083; C01G 23/043; H01C 7/001; H01B 1/08; C01P 2004/80; C01P 2006/40
See application file for complete search history.

(56) References Cited

U.S. PATENT DOCUMENTS 4,912,286 A * 3/1990 Clarke ....................... 174/110 A
4,987,515 A   1/1991 Iwaya et al.
(Continued)

FOREIGN PATENT DOCUMENTS

EP   0 438 839      7/1991
EP   0917830    *  7/1991
(Continued)

OTHER PUBLICATIONS

International Search Report Issued May 16, 2012 in PCT/EP11/073587 Filed Dec. 21, 2011.
(Continued)

*Primary Examiner* — Shawntina Fuqua
(74) *Attorney, Agent, or Firm* — Oblon, McClelland, Maier & Neustadt, L.L.P.

(57) ABSTRACT

An electrical heating element is provided, including a main body, the main body including a ceramic material and an electrically conductive path on a surface of the main body. The electrically conductive path includes a reduced form of the ceramic material, and has first and second contact portions for connection to a voltage source, and at least one electrically conductive pathway between the first and second contact portions. To form the electrically conductive path, the heating element main body is placed in a reducing environment at sufficient temperature to form the conductive path on the surface of the main body.

19 Claims, 2 Drawing Sheets

(56) References Cited

U.S. PATENT DOCUMENTS

| | | | |
|---|---|---|---|
| 5,408,574 | A | 4/1995 | Deevi et al. |
| 5,471,721 | A | 12/1995 | Haertling |
| 5,609,553 | A | 3/1997 | Hyllberg |
| 2012/0091541 | A1* | 4/2012 | Suchomel et al. ............ 257/411 |

FOREIGN PATENT DOCUMENTS

| | | |
|---|---|---|
| EP | 0 917 830 | 5/1999 |
| EP | 2 110 033 A1 | 10/2009 |
| JP | 2-38355 A | 2/1990 |
| JP | 3-233806 A | 10/1991 |
| JP | 5-115272 A | 5/1993 |
| JP | 2004-523662 A | 8/2004 |
| JP | 2007-502915 A | 2/2007 |

OTHER PUBLICATIONS

Office Action issued Aug. 26, 2015 in Japanese Patent Application No. 2013-545360 (with English language translation).

* cited by examiner

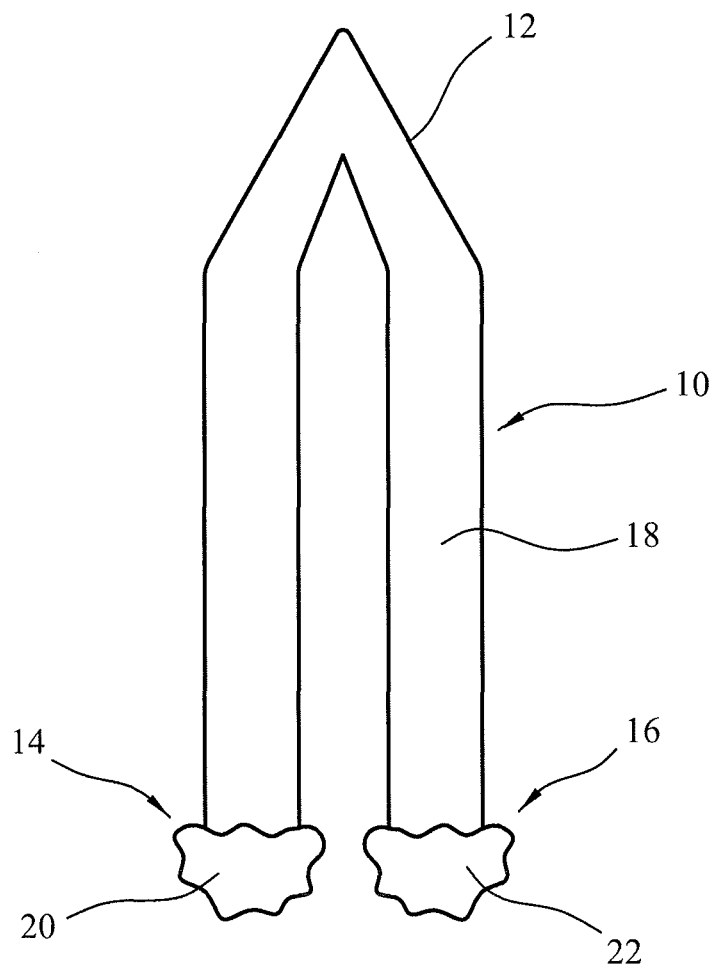
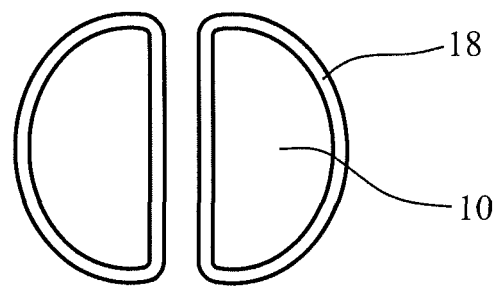
FIG. 1a
FIG. 1b

REDUCED CERAMIC HEATING ELEMENT

CROSS REFERENCE TO RELATED APPLICATION

This application is a national phase application based on PCT/EP2011/073587, filed on Dec. 21, 2011.

The present invention relates to an electrical heating element. More particularly, the invention relates to a heating element for heating an aerosol-forming substrate in an electrically heated aerosol-generating system. The present invention relates to a method of manufacturing a heating element, and to a method for manufacturing a heating element for heating an aerosol forming substrate in an electrically heated aerosol-generating system. The invention finds particular application as a heating element for heating an aerosol-forming substrate in an electrically operated smoking system and as a method for manufacturing a heating element for heating an aerosol forming substrate in an electrically operated smoking system.

Prior art documents, such as EP-A-0917830, describe heating elements for electrically heating tobacco products that consist of a plurality of discrete metallic heating elements running axially along the length of the smoking device, and spaced around its circumference. The heating elements are necessarily complex and expensive to manufacture as they require a number of metal forming steps.

Internal heating elements have also been proposed, which are inserted directly into the tobacco products. This provides for improved efficiency, as all heat energy is transferred to the sensorial media and it also allows for a reduction in the size of the smoking system, and in particular its diameter as there is less need for thermally insulating cladding.

The inventors have appreciated that it would be advantageous to provide a heating element suitable for use as an internal heating element in an electrically operated smoking system that is simple and inexpensive to manufacture and a manufacturing method for such a heating element that provides for flexibility in the heating element design.

According to a first aspect of the invention, there is provided an electrical heating element comprising a main body comprising a ceramic material and an electrically conductive path formed on or in the main body, the electrically conductive path comprising a reduced form of the ceramic material and having first and second contact portions for connection to a voltage source, wherein the main body is formed in a manner to receive an aerosol-forming substrate.

The electrically conductive path may be formed, for example, by placing the main body in a reducing environment at a sufficient temperature for a predetermined duration. Alternatively, the electrically conductive path may be formed using an electro-chemical reduction process. In either case the electrically conductive path is preferably formed as a conductive layer on a surface of the main body. Preferably, the depth of the conductive layer is less than 10 µm. The depth of the conductive layer can be selected by selecting the conditions under which it is formed, such as the temperature and duration of treatment. The extent to which it covers the main body may also be altered by selectively etching portions of the conductive path or by masking portions of the main body during the reduction process. In this way a desired resistance for the heating element can be obtained. In a preferred embodiment the resistance of the heating element is between 0.5 and 2 Ohms.

The main body may be formed fully or partially from a metal oxide and the conductive layer formed from the metal component of the metal oxide. For example, the main body may be formed from Zirconia and the conductive path formed from Zirconium. Alternatively, the main body may be formed of Alumina and the conductive path formed from Aluminium.

The electrically conductive path can perform as a resistive heater and can be provided on the main body in a many ways, allowing for great design flexibility.

The main body may be formed by injection moulding and sintering. The shape and size of the main body may be chosen to suit a particular application.

The electrically conductive path may completely cover a surface of the main body. Alternatively, the electrically conductive path may form a pattern on a surface of the main body. The pattern may define a plurality of electrically conductive pathways between the first and second contact portions.

The main body preferably has an elongate form with the first and second contact portions positioned at a first end of the main body and the electrically conductive path extending to and from a second end of the main body.

The main body may be formed in other shapes, such as in tubular form or in a planar form. The present invention allows for the use of complex shapes for the heating element that would be problematic when using a plating or deposition technique for forming a conductive layer.

Preferably, the main body has a substantially circular cross-section. This is beneficial because it allows for easy insertion in and removal from an aerosol forming substrate.

The main body may be covered with a passivation layer, such as glass. This increases the stability of the conducting path.

According to a second aspect of the invention, there is provided an electrically heated aerosol generating system for receiving an aerosol forming substrate comprising one or more heating elements in accordance with the first aspect of the invention and a voltage source coupled to the heating elements at the first and second contact portions.

According to a third aspect of the invention, there is provided a method of manufacturing an electrical heating element, comprising the steps of: forming a heating element main body, the main body comprising a ceramic material formed in a manner to receive an aerosol-forming substrate; placing the heating element main body in a reducing environment at sufficient temperature to form a conductive path on or in the main body, the conductive path comprising a reduced form of the ceramic material; and providing electrical contact portions for connection of the conductive path to a voltage source.

Preferably, the step of forming the heating element main body comprises injection moulding. Alternatively, the step of forming the heating element main body may comprise hot isostatic pressing, slip casting or dry pressing. The step of forming the heating element main body may further include machining. The step of forming the heating element main body may further comprise firing or sintering.

The reducing environment is preferably substantially free of oxygen. The step of placing the heating element main body in a reducing environment may comprise placing the main body in a hydrogen environment or a carbon monoxide environment. Preferably, the hydrogen environment comprises a flow of hydrogen gas. The temperature that is sufficient to form a conductive layer on the surface of the main body is dependent on the atmosphere and on the material composition of the main body. However, preferably the sufficient temperature is greater than 200° C. More preferably, the sufficient temperature is between 1000° C. and 1300° C. Preferably, the step of placing the heating element main body in a reducing environment comprises placing the heating element main body in a reducing environment for at least one hour and more preferably for at least two hours.

Preferably, the method further comprises forming a passivation layer on the heating element main body subsequent to the step of placing the heating element main body in a reducing environment. The passivation layer prevents, or substantially reduces, re-oxidation of the conductive path. The passivation layer may be formed from glass using a chemical vapour deposition or plasma phase deposition technique.

According to a fourth aspect of the invention, there is provided a method of manufacturing an electrical heating element, comprising the steps of: forming a heating element main body, the main body comprising a ceramic material formed in a manner to receive an aerosol-forming substrate; placing the heating element main body in a reducing electrolyte and performing an electro-chemical reduction of the heating element main body to form a conductive path on or in the main body, the conductive path comprising a reduced form of the ceramic material; and providing electrical contact portions for connection of the conductive path to a voltage source.

The reducing electrolyte may be calcium chloride.

An embodiment of the invention will be further described, by way of example only, with reference to the accompanying drawings, in which:

FIG. 1a is an illustration of a heating element in accordance with an embodiment of the invention;

FIG. 1b is a schematic illustration of a cross section of the heating element of FIG. 1a;

Figure 2:
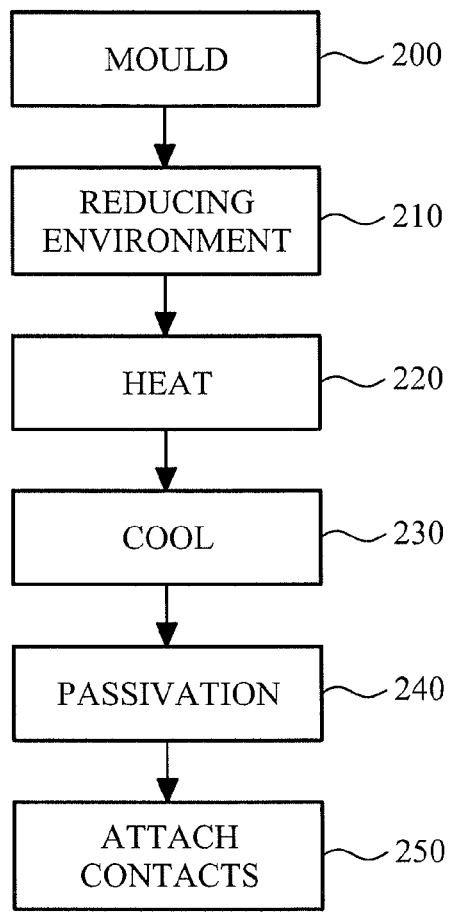
FIG. 2 is a flow diagram illustrating the process steps in accordance with an embodiment of the method of the invention.

FIGS. 1a and 1b illustrate one example of a heating element in accordance with the present invention. The heating element comprises a main body 10 formed from Zirconia (Zirconium Dioxide). The main body is in a generally V-shape having a tip end 12 and two back ends 14, 16. The main body can be in any desired shape and, in this example, is formed by injection moulding followed by any necessary machining. After machining the main body is fired and sintered to form a rigid body. The surface of the main body 10 is covered with a metal Zirconium layer 18, as is described with reference to FIG. 2. The Ziconium layer 18 is relatively electrically conductive compared to the Zirconia main body 10, and can be used as a resistive heating element. In this example the Zirconium layer has a resistance of about 0.1 Ω/mm.

Electrical contacts 20, 22 are located at the back ends of the heating element and are formed from a silver paste. The silver paste is used to provide electrical contact between the heating element and an external power source, and subsequent to electrical connection can be cured, preferably in an inert, oxygen free atmosphere. Other means of providing electrical contact may be used, such as laser welding, plasma arc welding or gas tungsten welding. However, in order to prevent oxidation of the reduced ceramics, the welding should be performed in an inert, oxygen free or even reducing atmosphere.

The application of a voltage across the heating element via the electrical contacts results in a current flow in the surface layer and therefore results in Joule heating on the surface layer. By applying a voltage of 8V across a heating element as shown in FIG. 1 an increase in temperature of the heating element of between 400 and 500° C. has been observed.

FIG. 1b is a cross section of the heating element 10, showing the surface layer 18 of Zirconium. FIG. 1b is not drawn to scale. In this example the thickness of the conductive surface layer is below 100 μm, preferably between 5 and 10 μm. However, there may not be a clear boundary between the conductive layer and the unreduced portion of the main body so that the measured thickness can vary between 5 μm and 100 μm. Instead, the level of reduction of the ceramic falls with distance below the external surface.

The heating element 10 is formed with a round cross section. The two legs of the heating element are formed with a substantially semicircular cross section so that the total cross section is approximately circular along its entire length. This makes insertion and removal of the heater element into and out of a substrate easier than with other shapes.

A heating element as illustrated in FIGS. 1a and 1b can be manufactured using a simple thermo-chemical process. Following the preparation of the main body 10 by moulding or other process, the surface layer 18 is formed by placing the main body in a reducing atmosphere at high temperature. The oxygen at the surface of the main body is removed under these conditions to leave a thin Zirconium layer.

FIG. 2 illustrates the steps taken in a method for manufacturing a heating element as shown in FIG. 1. In step 200 the main body is formed into the desired shape by injection moulding a Zirconia powder. The formed main body is then put into a hydrogen atmosphere in step 210 and heated to 1200° C. in step 220. The hydrogen atmosphere comprises a flow of hydrogen. The flow rate of the hydrogen can be used to control the rate and hence the amount of reduction of the main body. The duration for which the main body is in the reducing environment also affects the amount of reduction and so the resistance of the final heating element. In this embodiment the main body is held in the reducing environment for two hours. This process results in the formation of the conductive layer on the surface of the main body that penetrates into the main body. In step 230 the heating element is cooled. At this stage any surface patterning that is desired can be formed using standard etching or photolithographic techniques. In step 240 a passivation layer of glass is formed on the heating element main body using chemical vapour deposition. The passivation layer is formed while the heating element remains in an oxygen free environment and may be formed prior to any etching or photolithographic techniques. In step 250, the electrical contacts are fixed to the heating element using a silver paste and the heating element can then be fitted to the device in which it is to be used. Finally the silver paste is cured.

The heater illustrated in FIGS. 1a and 1b can be used in an electrically heated smoking system, and in particular to smoking devices that employ a relatively low temperature heat source to heat tobacco products in order to produce a tobacco flavour or tobacco flavoured aerosol. A heating element of this type has the advantage that it can be relatively simply and inexpensively manufactured and can be formed in any desired shape and size.

Figure 3:
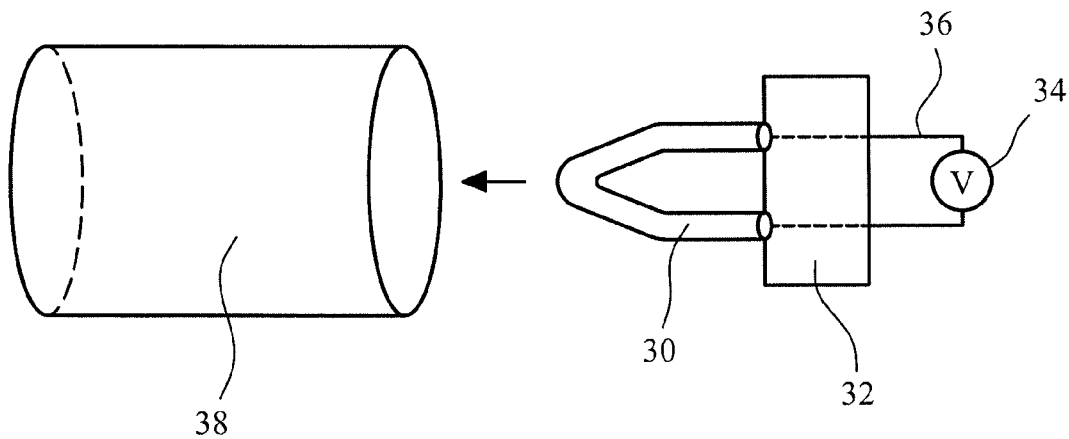
FIG. 3 is a schematic illustration of a heating element used in smoking article in accordance with an embodiment of the invention.

FIG. 3 is a schematic illustration of one example of a heating element in use with an aerosol-forming substrate, in exploded form. In FIG. 3, the heating element 30 is the generally V-shaped configuration shown in FIG. 1a. An insulating layer 32 is provided on the back side of the heating element to insulate the rest of the smoking device, including the voltage source 34, from the heating element. Electrical connections 36 extend to and from the voltage source 34, through the insulating layer 32 to the electrical contact portions on the heating element 30. The heating element is inserted into a plug of aerosol forming substrate 38. In use the heater heats the substrate material 38 to generate the desired aerosol.

It should be apparent that the heating element can be formed in many different configurations. For example the heating element may be formed as a hollow tube that surrounds an aerosol-forming plug, with the conductive layer formed only on a interior surface of the tube. This can be achieved by removing or electrically isolating the conductive layer formed on the exterior surface of the tube.

It should also be apparent that although the heating element has been described with reference to an electrically heated smoking device, it may equally be used for other applications. The flexibility in the shape and configuration of a heating element of this type means that it may be used in many different applications.

The invention claimed is:

1. An electrical heating element, comprising:
   a main body comprising a ceramic material and an electrically conductive path formed on or in the main body, the electrically conductive path comprising
   a reduced form of the ceramic material, and
   first and second contact portions configured to connect to a voltage source,
   wherein the main body is configured to removably pierce an aerosol-forming substrate, and
   wherein the electrically conductive path forms a pattern on a surface of the main body.

2. The electrical heating element according to claim 1, wherein the main body is formed fully or partially from a metal oxide, and the conductive path is formed from a metal component of the metal oxide.

3. The electrical heating element according to claim 1, wherein the main body is formed from Zirconia and the conductive path is formed from Zirconium.

4. The electrical heating element according to claim 1, wherein the main body has a substantially circular cross-section.

5. The electrical heating element according to claim 1, wherein the main body has an elongate form with the first and second contact portions positioned at a first end of the main body, and the electrically conductive path extends to and from a second end of the main body.

6. The electrical heating element according to claim 1, further comprising a passivation layer on an external surface of the main body.

7. An electrically heated aerosol generating system for receiving an aerosol-forming substrate, comprising one or more heating elements according to claim 1, and the voltage source being coupled to the one or more heating elements at the first and second contact portions.

8. A method of manufacturing an electrical heating element, comprising:
   forming a heating element main body comprising a ceramic material and being configured to removably pierce an aerosol-forming substrate;
   forming an electrically conductive path on the heating element main body by placing the heating element main body in a reducing environment at an elevated temperature, the electrically conductive path comprising a reduced form of the ceramic material and being formed in a pattern on a surface of the heating element main body; and
   providing electrical contact portions electrically connected to said conductive path and being configured to connect to a voltage source.

9. The method according to claim 8, wherein the placing the heating element main body in the reducing environment comprises placing the heating element main body in a hydrogen environment or a carbon dioxide environment.

10. The method according to claim 8, wherein the elevated temperature is between about 1000° C. and 1300° C.

11. The method according to claim 8, further comprising forming a passivation layer on the heating element main body subsequent to the placing the heating element main body in the reducing environment.

12. The method according to claim 8, wherein the forming the heating element main body comprises injection moulding.

13. A method of manufacturing an electrical heating element, comprising:
   forming a heating element main body comprising a ceramic material and being configured to removably pierce an aerosol-forming substrate;
   forming an electrically conductive path on the heating element main body by placing the heating element main body in a reducing electrolyte and performing an electro-chemical reduction of the heating element main body, the electrically conductive path comprising a reduced form of the ceramic material and being formed in a pattern on a surface of the heating element main body; and
   providing electrical contact portions electrically connected to said conductive path and being configured to connect to a voltage source.

14. The electrical heating element according to claim 1, wherein the main body has a V-shaped configuration comprising two separated portions joined at a tip end, the two separated portions having back ends respectively contacting the first and second contact portions, and the tip end being a base of the V-shaped configuration.

15. The electrical heating element according to claim 1, wherein the pattern defines an electrically conductive pathway on said surface between the first and second contact portions.

16. The electrical heating element according to claim 1, wherein the pattern defines a plurality of electrically conductive pathways on said surface between the first and second contact portions.

17. The electrical heating element according to claim 14, further comprising an insulation layer disposed between said back ends and the voltage source.

18. The method according to claim 9, wherein
   the forming the electrically conductive path on the heating element main body further comprises placing the heating element main body in the reducing environment for at least one hour, and
   the elevated temperature is greater than 200° C.

19. The method according to claim 13, wherein the reducing electrolyte is calcium chloride.

* * * * *